(12) United States Patent
Curran, Sr. et al.

(10) Patent No.: US 6,188,015 B1
(45) Date of Patent: Feb. 13, 2001

(54) ELECTROMAGNETIC INTERFERENCE ATTENUATION DEVICE

(75) Inventors: William E. Curran, Sr., Medinah; Michael T. Egan, Glen Ellyn; Joseph C. Weibler, West Chicago, all of IL (US)

(73) Assignee: The Curran Company, Glendale Heights, IL (US)

( * ) Notice: Under 35 U.S.C. 154(b), the term of this patent shall be extended for 0 days.

(21) Appl. No.: 09/089,299

(22) Filed: Jun. 2, 1998

(51) Int. Cl.$^7$ ........................................................ H05K 9/00
(52) U.S. Cl. ............................ 174/35 MS; 361/816; 361/818; 52/171.1; 442/6; 174/35 R
(58) Field of Search .................. 174/35 MS, 35 R; 361/816, 818; 348/819, 823; 313/479; 52/171.1; 442/6, 32

(56) References Cited

U.S. PATENT DOCUMENTS

| | | | |
|---|---|---|---|
| 3,305,623 | * 2/1967 | Bakker et al. | 174/35 |
| 4,247,737 | * 1/1981 | Johnson et al. | 174/35 MS |
| 4,412,255 | * 10/1983 | Kuhlman et al. | 358/245 |
| 4,435,465 | * 3/1984 | Ebneth et al. | 428/195 |
| 4,772,760 | * 9/1988 | Graham | 174/35 R |
| 4,978,812 | * 12/1990 | Akeyoshi et al. | 174/35 MS |
| 5,012,041 | * 4/1991 | Sims et al. | 174/35 MS |
| 5,017,419 | * 5/1991 | Smith | 428/209 |
| 5,147,694 | * 9/1992 | Clarke | 428/34 |
| 5,239,125 | * 8/1993 | Savage et al. | 174/35 MS |

\* cited by examiner

*Primary Examiner*—Kristine Kincaid
*Assistant Examiner*—W. David Walkenhorst
(74) *Attorney, Agent, or Firm*—Cherskov & Flaynik

(57) ABSTRACT

An EMI attenuation device including at least two substrates such that the spacing between these substrates is selected to maximize shielding performance at a particular frequency. The device further includes additional substrates arranged at predetermined distances from the first two substrates to optimize shielding performance. A method also is provided for a multi-step, attenuation of impinging EMI, wherein the method also enables see-through and/or hear-through monitoring. Salient features of the method include relatively positioning a plurality of electrically conductive substrates, each of a particular topology, so as to maximize attenuation of the EMI at particular frequencies.

25 Claims, 10 Drawing Sheets

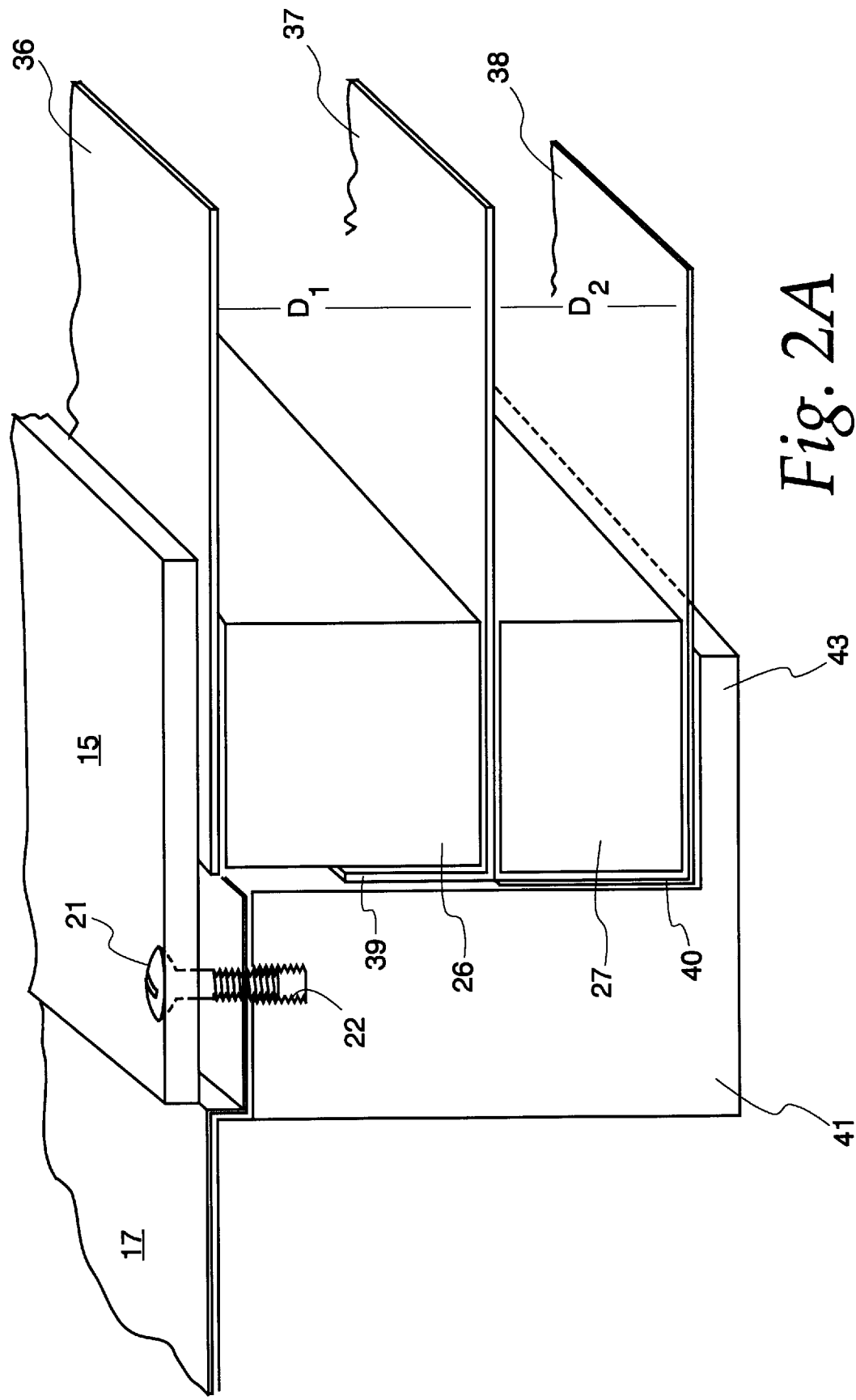

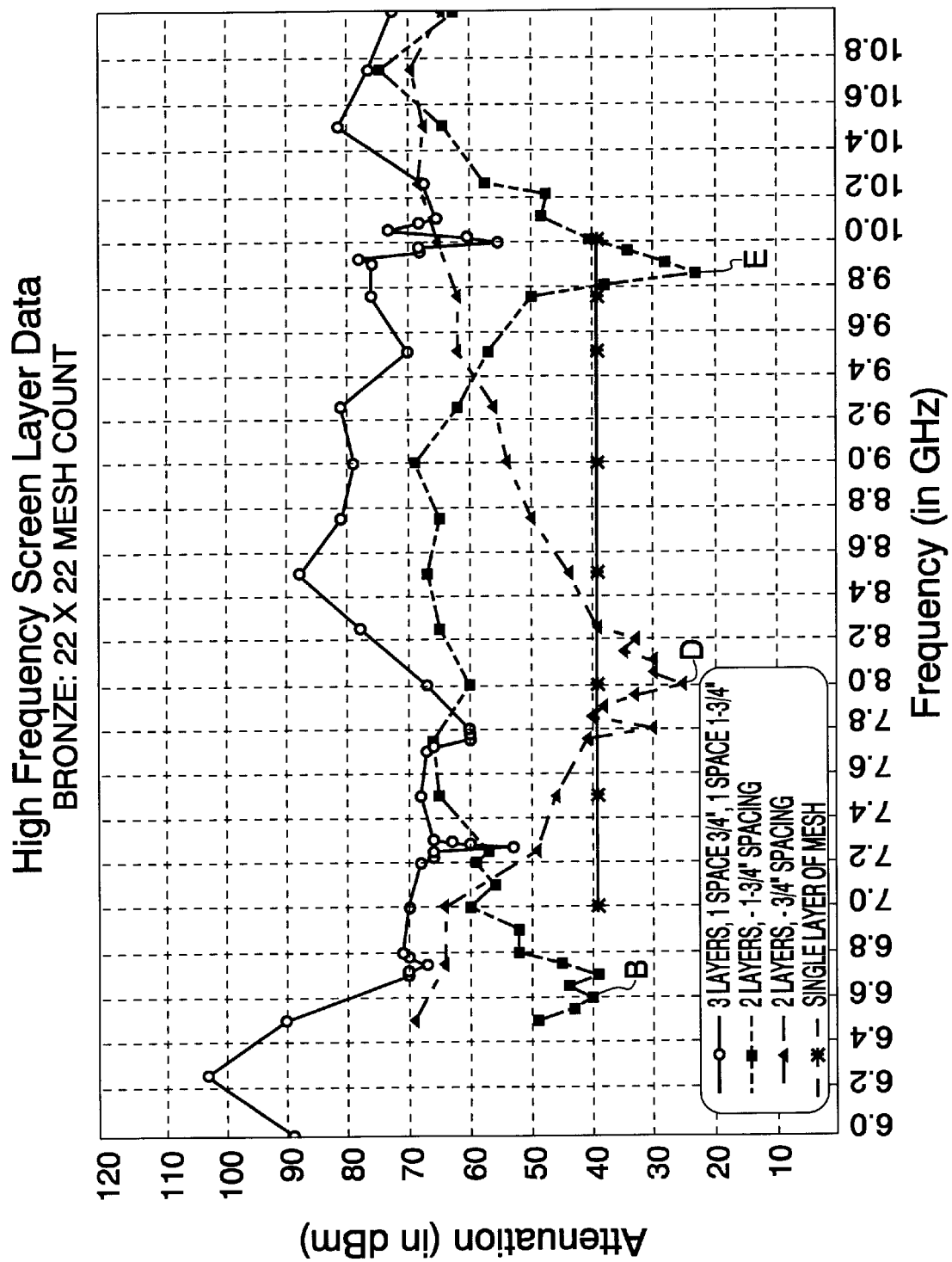

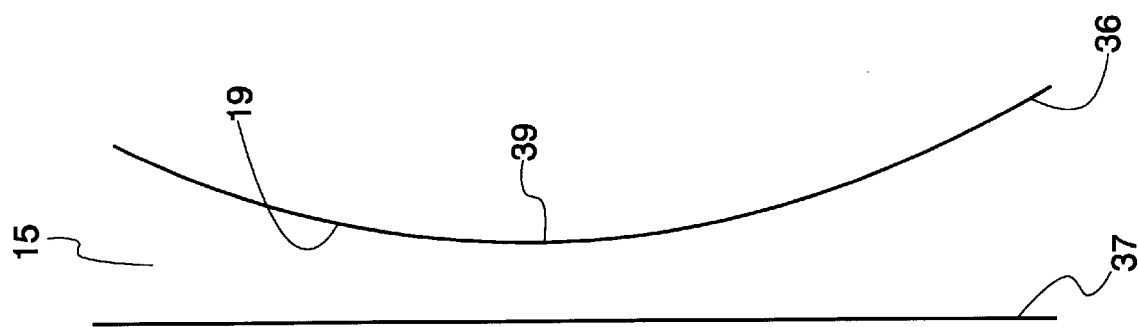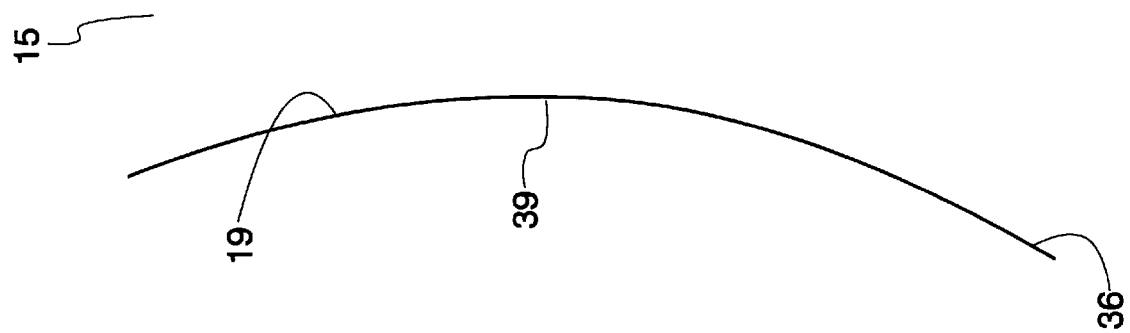

ELECTROMAGNETIC INTERFERENCE ATTENUATION DEVICE

BACKGROUND OF THE INVENTION

1. Field of the Invention

The present invention relates to electromagnetic interference (EMI) shielding, and more particularly, to the use of multi-layered shielding substrates for optimizing EMI attenuation at frequencies over 100 megahertz (MHz) and especially much higher frequencies in a see-through configuration.

2. Background of the Invention

The atmosphere of industrialized society is constantly bombarded with electromagnetic radiation. Such radiation exists in a wide frequency band and typically emanates from electrical equipment as radio waves. While moderate levels of electromagnetic radiation are currently considered to be relatively harmless to living tissue, this same radiation wreaks havoc in the operation of some electronic instruments and equipment.

Shielded enclosures are required to isolate sensitive apparatus from electromagnetic radiation in a variety of situations, including nuclear magnetic resonance (NMR) imaging, electronic testing of communication equipment, and confidential data communications. Often, emission from electronic equipment also needs to be contained. EMI shielding is often accomplished by coating the walls of enclosures with one or more electrically continuous layers of a metallic conducting material (copper, aluminum, bronze, or steel for instance). The shielding layers are usually grounded at a single point to conduct to the earth the electromagnetic energy absorbed by the shield. It is of crucial importance that there be no gaps in this electrically conducting shielding even where apertures such as doors and windows are provided.

Often windows are required in a variety of shielding enclosures so that observers, supervisors, and even operating technicians may remain outside the enclosure while visually monitoring activities occurring inside the enclosure. In NMR imaging, also known as Magnetic Resonance Imaging (MRI), the patient and the extremely sensitive MRI equipment are located inside an EMI shielded enclosure. This is to create an interference free environment to avoid artifacts or pictorial flaws in the final image. Typical examples of screens and windows designed into EMI attenuation devices are disclosed in U.S. Pat. Nos. 4,701,801; 5,012,041; 5,017,419; 5,239,125; and 5,295,046.

Windows for EMI/RFI enclosures must be shielded and in continuous electrical contact with the wall shielding of the enclosure. Also, the window substrate must provide enough "see-through" and in some cases "hear-through" transparency to allow for outside monitoring by supervising personnel. As such, it is desirable to minimize optical distortion by the window substrate.

Windows comprising single and two layered screens, optically clear metallized coated-glass or clear plastic or other conductive materials, or combinations of the above mentioned, have been utilized to attenuate EMI while being optically transmissive. Shielding effectiveness is dependent upon parameters that include screen mesh patterns, wire diameter, grid count, and conductive material thickness and type.

When screens are utilized, one determinant of shielding effectiveness ($S_E$) is a function of the distance (g) between the grid wires of each individual screen, restated in the following equation:

$$S_E = f(g)$$

As $g \to 0$, the E-field attenuation increases at higher frequencies. However, this also results in an unwanted decrease in desirable "see-through" and "hear-through" characteristics of the resulting substrate.

Windows comprised of one screen provide some EMI attenuation, but this attenuation decreases by approximately 20 dB for each power of ten ("decade") increase in frequency above 1 MHz, as illustrated in White, Donald R. J. *Electromagnetic Shielding Materials and Performance.* 2nd Ed., 1980 (Don White Consultants, Inc., Gainesville, Va.). As a result, appreciable amounts of electromagnetic radiation permeate through single screen structures as frequencies increase appreciably.

Windows consisting of two parallel screens improve attenuation somewhat, as illustrated in the exemplary two-screen EMI window disclosed in U.S. Pat. No. 5,012,041, and incorporated herein by reference. The '041 patent teaches using two parallel screens comprising relatively different wire sizes and spacings to both attenuate EMI and also reduce moire patterns.

However, the inventors have found that a double parallel screen structure produces attenuation performance anomalies above 100 MHz and especially at frequencies in the one giga Hertz (GHz) to 10 GHz frequency range. These anomalies occur as a function of the screen separation and are especially severe whenever the distance separating the two planar screens equals a multiple of one half the wavelength ($\lambda$) of the impinging electromagnetic wave, as defined by the equation $c = f\lambda$ where c is the speed of light and f is the frequency of the wave. In these instances the space between the screens forms a resonant cavity at each of the corresponding frequencies and integral multiples thereof. This results in a significant degradation in EMI attenuation at or near the resonant frequency and its harmonics. The existence of such resonant transmission poses problems for imagers, one such problem being that the resulting transmitted radiation may be mistaken for a signal emanating from an object under study. Furthermore, the inventors have found that resonant transmission can occur at other frequencies. As a result of such resonance-generating phenomena, two-screen systems often have poorer attenuation characteristics at certain frequencies compared to single screen systems.

Simply adding additional layers of screening to the two-screen configuration without regard to the relative separation between the screens can be counter-productive because the additional screens introduce additional resonant frequencies which are a function of the spacing between the screens.

A need exists in the art for a method and device that provides improved attenuation of EMI at frequencies higher than 10 MHz and especially in the 1 GHz to 10 GHz range while preserving sufficient see-through and hear-through characteristics. The method and device should utilize commercially available materials and should also facilitate easy maintenance and replacement.

SUMMARY OF THE INVENTION

An object of the present invention is to provide an EMI shielding method and device having optimum attenuation performance that overcome many of the disadvantages of the prior art.

Another object of the present invention is to provide a method for attenuating EMI at a myriad of frequencies. A feature of the method is the juxtaposition of the surfaces of light-weight see-through and hear-through electrically conductive materials in a predetermined configuration relative to each other so that a first series of the materials attenuates incoming EMI and a second series of materials further attenuates the attenuated EMI. An advantage of the invention is a reduction of the propagation of resonant electromagnetic radiation through multiple layers of materials so as to tune or optimize performance of the method at specific electromagnetic radiation frequencies above 10 MHz.

Another object of the present invention is to provide a device with EMI shielding performance at or exceeding 100 decibel (dB) attenuation levels for frequencies from 100 MHz up to 10 GHz. A feature of the present invention is the incorporation of a plurality of screens comprised of conductive materials. An advantage of the present invention is the graduated attainment of higher levels of EMI/RFI shielding performance in a see-through and/or hear-through environment.

Still another object of the present invention is to provide an EMI attenuating device comprised of lightweight screens or other conductive but optically transparent materials. A feature of the invention is the specific juxtaposition of the surfaces of the screens relative to each other. An advantage of the invention is the incorporation of cavities which stymie radiation-wave resonance and harmonics at EMI frequencies of interest, therefore reducing the propagation of the EMI through the substrate.

Briefly, the invention provides for an EMI attenuation device comprising a first electrically conductive member spatially positioned adjacent to a second electrically conductive member; a third electrically conductive member spatially positioned adjacent to said second electrically conductive member and with said first electrically conductive member being spatially separated from said second electrically conductive member a distance dissimilar to the distance spatially separating said second electrically conductive member from said third electrically conductive member.

The invention also provides a method for reducing the transmission of electromagnetic radiation comprising subjecting the electromagnetic radiation to regions which prevent passage of the electromagnetic radiation and which also prevents the production and passage of resonant frequencies of the electromagnetic radiation.

Also provided is a method for attenuating electromagnetic radiation comprising subjecting the radiation to a plurality of resonant cavities having dissimilar dimensions and different resonant frequencies so that radiation resonating within a specific cavity is blocked by said other cavities.

A window for use in conjunction with an EMI-shielded enclosure is provided with the window comprising at least two electrically conductive surfaces with no two adjacent surfaces being parallel.

This invention further provides a method for attenuating electromagnetic radiation comprising causing the electromagnetic radiation to strike a first electrically conductive substrate, resulting in a first portion of the electromagnetic radiation not permeating or passing through the first substrate and a second portion of the electromagnetic radiation permeating through the first substrate; and subjecting the now-permeated radiation to a means for preventing the production of resonance frequencies of the now-permeated radiation.

In another embodiment, the invention provides for a device for attenuating electromagnetic interference comprising a first defined space having a plurality of walls configured from first and second electrically conductive shielding means; a second defined space having a plurality of walls configured from said second electrically conductive shielding means and a third electrically conductive shielding means; and means for positioning said first, second and third shielding means whereby distances between adjacent walls of said first and second shielding means are dissimilar to corresponding collinear distances between adjacent walls of said second and third shielding means.

Still another embodiment of the invention is an EMI attenuation device comprising two electrically conductive surfaces with said surfaces separated by an average distance, wherein said average distance is selected to obtain maximum attenuation at a pre-determined frequency.

BRIEF DESCRIPTION OF THE DRAWINGS

The present invention together with the above and other objects and advantages may best be understood from the following detailed description of the embodiment of the invention illustrated in the drawing, wherein:

FIG. 2A is a cross-sectional view of FIG. 1 taken along line 2—2, depicting an exemplary means for mounting electrically conductive substrate to a frame, in accordance with features of the present invention;

FIG. 4 is a graph showing EMI Shielding in the 6 GHz to 11 GHz frequency range when one, two and three layers of conductive substrate are utilized, in accordance with the present invention;

FIG. 5A is a side elevation view of a window comprising non-parallel conductive surfaces, in accordance features of the present invention;

DETAILED DESCRIPTION OF THE PREFERRED EMBODIMENT

A method and device is presented for attenuating EMI using light-weight materials. The invention is unique in providing acceptable "see-through" and/or "hear-through" properties in a light-weight configuration while also providing superior attenuation levels at frequencies above 100 MHz. The invention can be utilized to provide shielding protection over large surface areas. The invention also can be utilized to provide windows into a shielding enclosure without negatively affecting the shielding integrity of the enclosure to the same degree as is seen with typical two layer screen configurations.

Generally, the invented method and device incorporate a means for substantially attenuating incoming and/or outgoing EMI, and then dampening the oscillations of the remaining EMI to substantially attenuate the remaining resonant electromagnetic radiation. At EMI frequencies of up to 10 GHz, attenuations approaching or exceeding 100 dB are achieved. The invention is particularly useful in providing these higher attenuation levels at frequencies between 1 GHz and 4 GHZ.

The invention is particularly useful in optimizing shielding effectiveness at particular wavelengths. This "optimization" occurs by tuning the invented device by varying the relative shapes and/or distances of adjacent shielding surfaces comprising the device.

The attenuating means generally comprises a plurality of surfaces such as electrically conductive screens juxtaposed to each other in a parallel or nonparallel configuration and at predetermined distances to each other so as to provide increased attenuation through a plurality of chambers or cavities. Aside from initially attenuating impinging EMI, the prearranged screens also minimize the production of any sympathetic generation or resonance of the impinging EMI by imperfectly transmitting (i.e. transmitting, reflecting, or re-reflecting out of phase) any remaining EMI not initially attenuated by the screens. This transmission occurs within the cavities formed by multiple-electrically conductive substrate arrangement. In effect, the screens, arranged a predetermined way, initially block a portion of impinging EMI and prevent coherent superposition of the remaining EMI.

For example, in a configuration comprising three or more electrically-conductive substrates, the first and second substrates closest to the EMI source serve to attenuate the EMI while the remaining substrate or substrates facilitate further attenuation of the remaining EMI. This arrangement optimizes performance of the invention at particular frequencies. Depending on the target frequency or frequencies, the distance of the substrates from each other, and also the shape/topography of each of the surfaces, are experimentally derived to assure these optimum attenuation performances.

Figure 1:
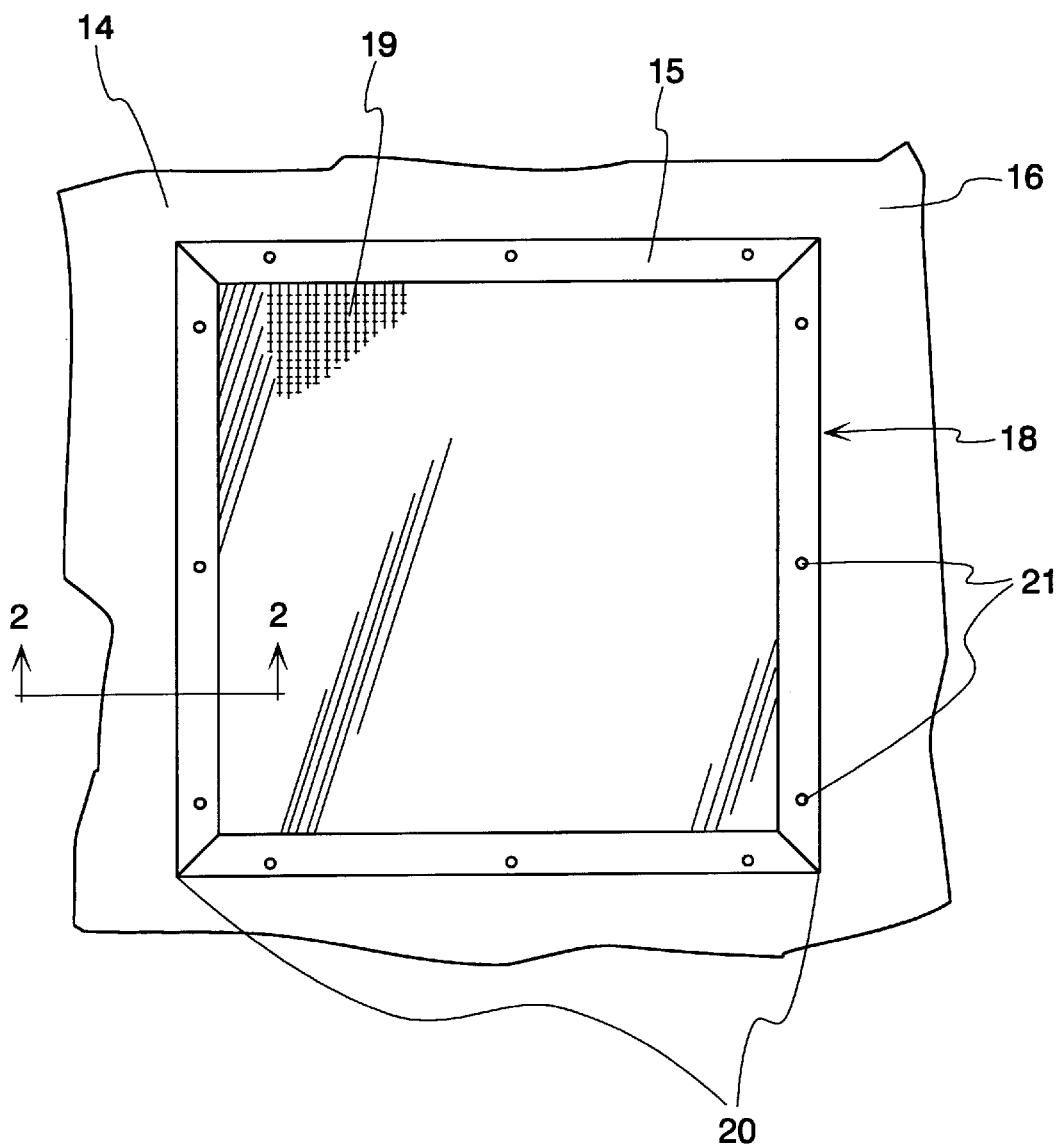
FIG. 1 is a fragmentary elevational view of an attenuation device, in accordance with the present invention.

An exemplary EMI attenuation device incorporating the features of the invention is depicted in FIG. 1 as being included into a wall 14 of a shielded enclosure 16 such as a room. Mounted in the wall 14 is the invented attenuation device designated as a whole as 18 and constructed in accordance with the principles of the invention. The attenuation device 18 is provided with an improved, multiple substrate configuration 19 for achieving high EMI shielding in the 1 GHZ to 10 GHZ frequency range.

The enclosure 16 including the wall may be of any preferred type of construction. The wall includes an opening 20 to accommodate either a window incorporating the invented multiple-substrate configuration, or a modular panel incorporating the invented multiple-substrate configuration. AS more clearly depicted in FIG. 2A, which is a cross-sectional view of FIG. 1 taken along line 2—2, a shielding layer 17 of metal on the outer surface of the wall 14 is continuous around the entire closure 16 with its edges extending to the opening 20 so as to confer continuous electrical contact between the attenuation device 18 set within the opening and the shielding layer 17. The attenuation device 18 is secured to the window by means of fasteners 21.

While the invented multi-screen substrate can be applied in large sheets to confer EMI attenuation to large enclosure surfaces, smaller modular substrates can also be provided incorporating the same positioning of the screen members.
Detail of 3-substrate
Module Construction The invented shielding system comprises a plurality of shielding substrates. The substrates are generally smooth topographically, though not necessarily flat or planar. Furthermore, the substrates are arranged relative to each other collinearly so that there is one substrate as a point of reference to which other substrates are arranged proximally or distally.

As depicted schematically in FIGS. 2A, 2B, 2C, and 2D, an exemplary shielding system includes first, second and third shielding substrates 36, 37 and 38, covering the entire opening 20. Any means for mounting or positioning the substrates relative to each other in a predetermined configuration while also maintaining electrical contact with the room enclosure are suitable.

The configuration depicted in FIG. 2A accommodates rigid conductive substrates, flexible conductive substrates, or combinations of rigid and flexible substrates. As shown therein, the three-substrate module includes structural frames 26 and 27 adapted to be received and communicate with substantially the entire periphery of the opening. The frames can be of similar cross sectional shape throughout. One embodiment of the frames 26 and 27 are extruded shapes of a metal having mitered corners. Suitable metal includes, but is not limited to, tin-plated brass, other alloy, aluminum, or steel. Optionally, the corners are configured with conductive resilient strips thereon so as to assure even greater intimate electrical contact between the module frame members 26, 27 and the window periphery. A frame support 41, which itself is in electrical contact with and embedded in the wall 14 of the enclosure, serves to define the periphery.

Generally, any material that is conductive or that can be rendered conductive is suitable frame support material or frame material. As such, the frame can either be a solid material (i.e. homogenously conductive) or can be constructed of nonconductive material which is coated with a conductive material. Coatings starting at 1 mil in thickness are suitable. As such, the frame support members 41 can be coated with a highly conductive and generally non-oxidizing metal such as tin.

In instances where either rigid conductive substrate, or flexible conductive substrate are used or combined, a substrate clamping means of the type depicted in FIG. 2A can be employed. Generally, the lap plate 15 is utilized to squeeze or clamp the framing members 26, 27 to each other and to the conductive substrates 36, 37, 38. Clamping action, directed toward the medial plane of the opening, whereby the plane is parallel to the EMI attenuation module being installed, is effected via fasteners 21 or tightening means such as a bolt. The bolt is received by a region of the window frame support means 41 forming a complementary, mating surface, such as a threaded aperture 22.

The frame support 41 further comprises a lip 43 extending inwardly to the center of the opening and at a right angle to the plane of the module. The lip serves as a back stop for the substrate supporting frames 26 and 27 which are pressed together and up against the lip by the lap plate 15. Additional means for fastening the lap plates 15 to the shielding layer 17 are also suitable. For example, another bolt-aperture configuration inwardly from the first bolt-aperture configuration so as to fasten the lap plate directly to the frame member 26 will provide additional stability while also enhancing electrical contact between the frame member 26 and the plate 15.

Figure 2B:
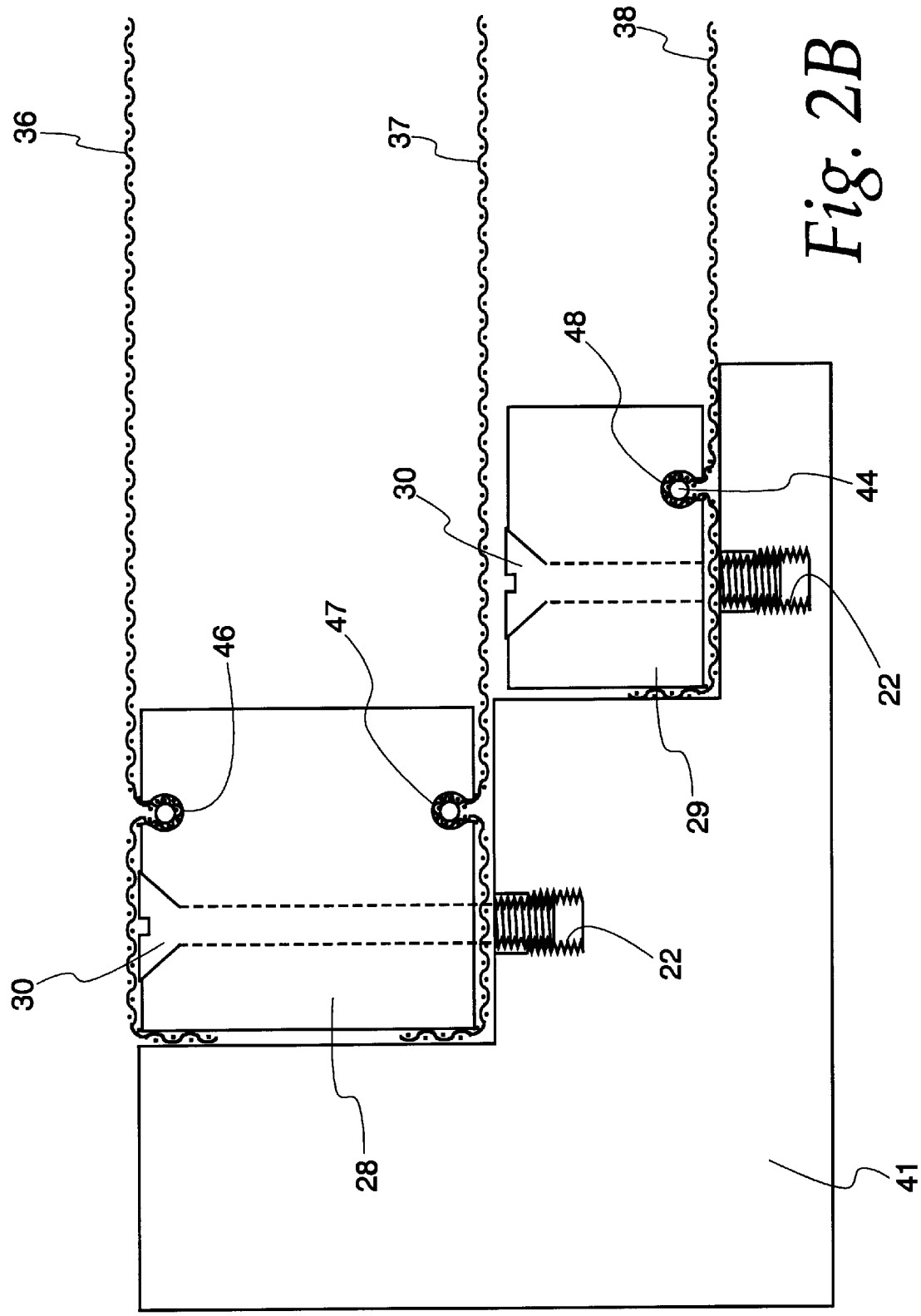
FIG. 2B is a cross-sectional view of another exemplary means for mounting electrically conductive substrate, in accordance with features of the present invention.

In instances where only flexible substrates are used (e.g., screens), alternative frame members 28 and 29, as shown in FIG. 2B, can be utilized. These configurations have arcuate-shaped channels 46, 47, 48 members to first receive the edges of the flexible screens. Flexible beads or splines 44 adapted to be received by the channels 46, 47, 48, are then tightly wedged into the channels to assure enhanced electrical contact between the screens and the frame. Such a screen fastening mechanism is further disclosed in U.S. Pat. No. 5,012,041, which is owned by the instant Assignee and previously incorporated herein by reference.

While the frame members 28 and 29 can be stacked and pressure fitted as are the frame members 26 and 27 of FIG. 2A, FIG. 2B provides an alternative embodiment wherein one of the frame members 29 are situated medially from the other frame member 28 and medial to the center of the window opening so as to effect piece-meal installation of the electrically conductive substrates 36, 37, and 38.

The framing members 28, 29 are removably mounted to the window frame support 41 via standard male-female threaded configurations 30. In this instance, the fasteners, such as bolts, are adapted to be slidably received by regions of the framing members forming transverse apertures. The ends of the bolts are anchored to regions of the window frame support forming a threaded aperture, 22. Optional camming devices or "pull-up" pins (which can be in addition to or operate in conjunction with the male-female attachment means 30 above) can be situated about the periphery of the screens being installed and used to adjustably stretch each screen. Such stretching or relaxing of the screen surface can be effected either during initial installation or subsequent to installation as an ancillary "tuning" mechanism. For enhanced mechanical and electrical contact, the screens are wrapped around the framing members 28 and 29.

Figure 2C:
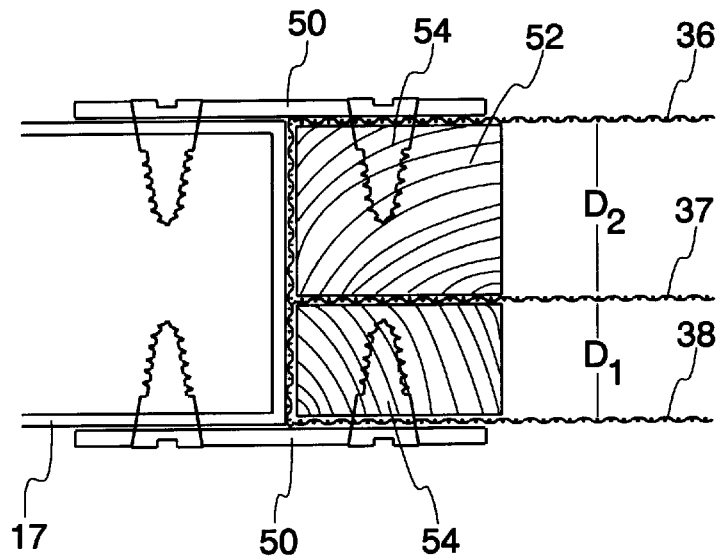
FIG. 2C is a sectional view of another exemplary means for mounting electrically conductive substrate, in accordance with features of the present invention.

Yet another substrate mounting method is depicted in FIG. 2C. In this embodiment, screens 36, 37, and 38, or some other electrically conductive substrates are maintained in electrical contact with each other and with the shielding layer 17 via simple fastening and clamping means. In this instance the screens are sandwiched between conductive lap plates 50 which in turn are in electrical contact with the shielding layer 17 and the screens 36, 37, and 38. Any means for fastening the lap plates 50 to the shielding layer 17 are suitable as long as intimate electrical contact is effected and maintained, such fastening means including but not limited to tap screws 54, welding, and friction fitting.

To maintain the opposing surfaces of adjacent electrically conducting substrates a predetermined distance $D_1$, and $D_2$ apart from each other, filler material 52, adapted to receive, anchor or otherwise cooperate with the tap screws can be utilized.

Figure 2D:
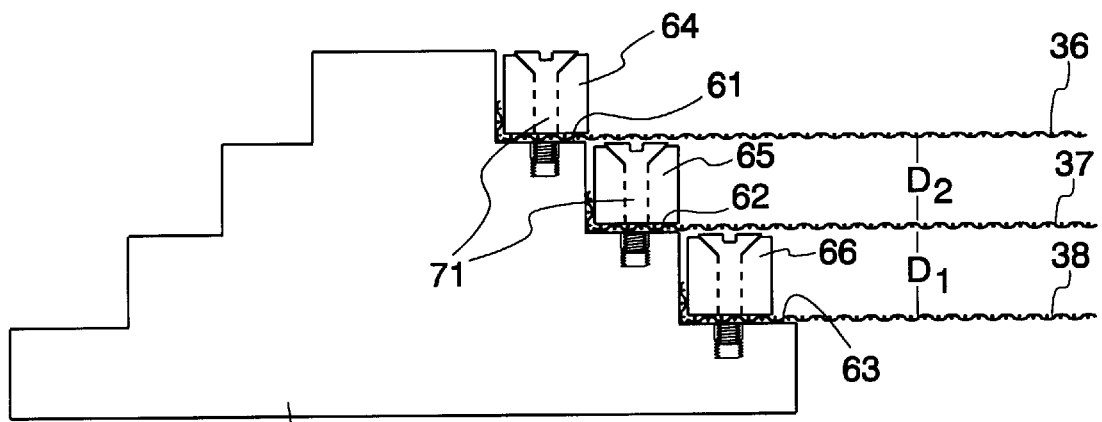
FIG. 2D is a sectional view of another exemplary means for mounting three electrically conductive, in accordance with features of the present invention.

Yet another substrate mounting configuration is depicted in FIG. 2D. This configuration allows for the separate mounting of frames 64, 65, and 66, onto frame-support surfaces 61, 62, and 63, respectively, whereby the frame-support surfaces are arranged in an inclined, step-like configuration. The stepped, frame-support surfaces can be integrally molded to each other to define a single frame mounting structure 68, or else separately configured and attached together by the myriad of clamping or bolting means, discussed supra. Similarly, the individual frames 64, 65 and 66 are reversibly attached to the frame support surfaces by means of screws, bolts or other fasteners 71. A salient feature of this mounting configuration is enabling piece-meal installation of individual framed substrates, thereby facilitating installation, maintenance, replacement, and cleaning of selected substrates, all from one side of the enclosure.

One or a plurality of electrically conductive substrates can be used to provide the plurality of electrically conductive surfaces discussed herein. For example, while the exemplary mounting configurations easily accommodate separate pieces of conductive substrate, a single piece of flexible electrically conductive substrate can be folded or otherwise arranged to provide said surfaces. Such utilization of a single piece of flexible, electrically conductive substrate can be envisioned in FIGS. 2A–2C, wherein the surfaces 36, 37, and 38 are formed of a single piece of flexible substrate serpenting through the mounting assembly and the filler substrates.

Substrate Distance Detail

A myriad of distances between the screens have been found to provide good attenuation. Under some circumstances, screen separations of up to 30 inches, but typically ⅓ to 12 inches, may be employed to optimize EMI shielding. Generally, distances of between 1.5 inches and 2.0 inches separating the first and second screens and distances between 0.5 inches and 0.75 inches separating the second and third screens provide good results. In some instances, and depending on the EMI frequency targeted, distances $D_1$ between substrates should not be equal to an integral multiple of other distances $D_2 \ldots D_x$, between other substrates. In one exemplary embodiment, the third screen 38 is positioned in relation to the first and second screens 36 and 37 such that the distance between the first and second screens 36 and 37 is approximately but definitely not exactly one-half the distance between the second and third screens 37 and 38. Although dependent upon EMI frequency, the preferred maximum distance separating the second and third screens 37 and 38 is approximately two inches.

As discussed supra, the dissimilar and non-integral multiple distances between the three screens are incorporated into the invention so that when the first and second screens form what may be considered a resonant cavity, the third screen blocks the transmission of the resonant radiation. Conversely, when the second and third screens form a resonant cavity, the first screen blocks the transmission of the resonant radiation.

Electrically Conductive
Substrate Material Detail

The shielding substrates 36, 37 and 38 are fabricated from electrically conductive material. Substances having resistivities of up to 12 ohms per square are suitable. Thus, a square-shaped EMI attenuation module should not have a resistance of more than 12 ohms when this resistivity is measured across two parallel sides of the square. When a larger area of electrically conductive substrate is selected, a correspondingly thicker conducting layer is required. Often, the thicknesses of conducting layers are dictated by transparency requirements, and not resistivity requirements. Generally, substrates having conductivities falling in the range of $0.10 \times 10^7$ mhos/meter to $6.25 \times 10^7$ mhos/meter are good choices.

A myriad of types of electrically conductive material can be utilized including, but not limited to, gold, silver, bronze, copper, aluminum, stainless steel and combinations thereof.

The inventors have found that certain, relatively highly reflective (i.e. conductive) materials (such as bronze, copper, and stainless steel) used for the middle screen 37 confer high attenuation characteristics.

Other embodiments are also suitable as electrically conductive substrates, including, but not limited to, composite materials comprising rigid or flexible transparent structures (e.g. plastic or glass) coated with a highly conductive and optically clear metal or grid coating. The conductive material can be applied via flame spraying, through electrodeposition (such as plasma spraying) or other means. This method allows the use of an optically clear, conductive coating that is but a few Angstroms thick or thicker in case of a grid pattern. As a consequence, such optically clear materials have the advantage of better optical transmission than self supporting screens. Suitable optically clear materials are provided by Pilkington United Kingdom, Ltd of St. Helens, England, through Tempest Security Systems Inc., Troy, Ohio.

As mentioned throughout, the substrates can be utilized in flat planar sheet configurations, curved sheet arrangements, or in configurations utilizing both planar and angled configurations. For example, FIG. 2A depicts generally planar substrates 37, 38, the peripheries of which define upward angled portions 39 and 40, respectively. These angled regions are optionally provided to further enhance electrical contact between the substrates and framing support member 41.

Screen Substrate Detail

Where screens are utilized as conductive substrates, several different mesh-counts are suitable. The mesh pattern is defined as the number of openings along a given linear or orthogonal direction amounting to one inch in length. As noted supra, mesh size varies between the screen. Generally, mesh counts between 14 (coarse) and 60 (fine) provide good attenuation results. In one embodiment, whereby maximum attenuation is desired, with less emphasis on minimizing moire patterns, the first shielding screen 36 may have a relatively coarse mesh pattern, the second screen 37 may have a comparatively finer mesh pattern, and the inner-most screen 38 may have the finest mesh pattern of all three screens. However, the screens may be installed in any order to achieve the desired attenuation effects. Where screens are utilized, it is advantageous in many instances to have assemblies, such as those depicted in FIGS. 2B and 2D, wherein the screens are separately removable for easy cleaning, maintenance and change-out.

Besides the three screens having different mesh patterns, the three screens also may be oriented such that the array of wires of each screen are angularly offset to the arrays of wires of each of the other two screens. Offset angles between 15 and 45 degrees yield the best performance. The offset arrangement minimizes moire effects.

The screens may be formed of many different structures. Suitable screens comprise conductive strands arranged in a triangular, orthogonal, or other polygonal array. Also, the actual diameter of the screen's wires can differ, with generally thicker wires conferring greater rigidity.

Aside from woven wire cloth, other configurations such as, but not limited to, lattices, expanded grates, perforated sheets, and electrically-conductive grids vacuum deposited on non-metallic substrates (such as glass sheets in the case of windows) are suitable. Often a continuous film is deposited and then the excess metal is etched away. When metallized patterns on a transparent substrate are employed, the rigidity of the surface depends on the width and thickness of the metal elements of the grid deposited on the substrate.

Examples of Shielding Performance

Figure 3:
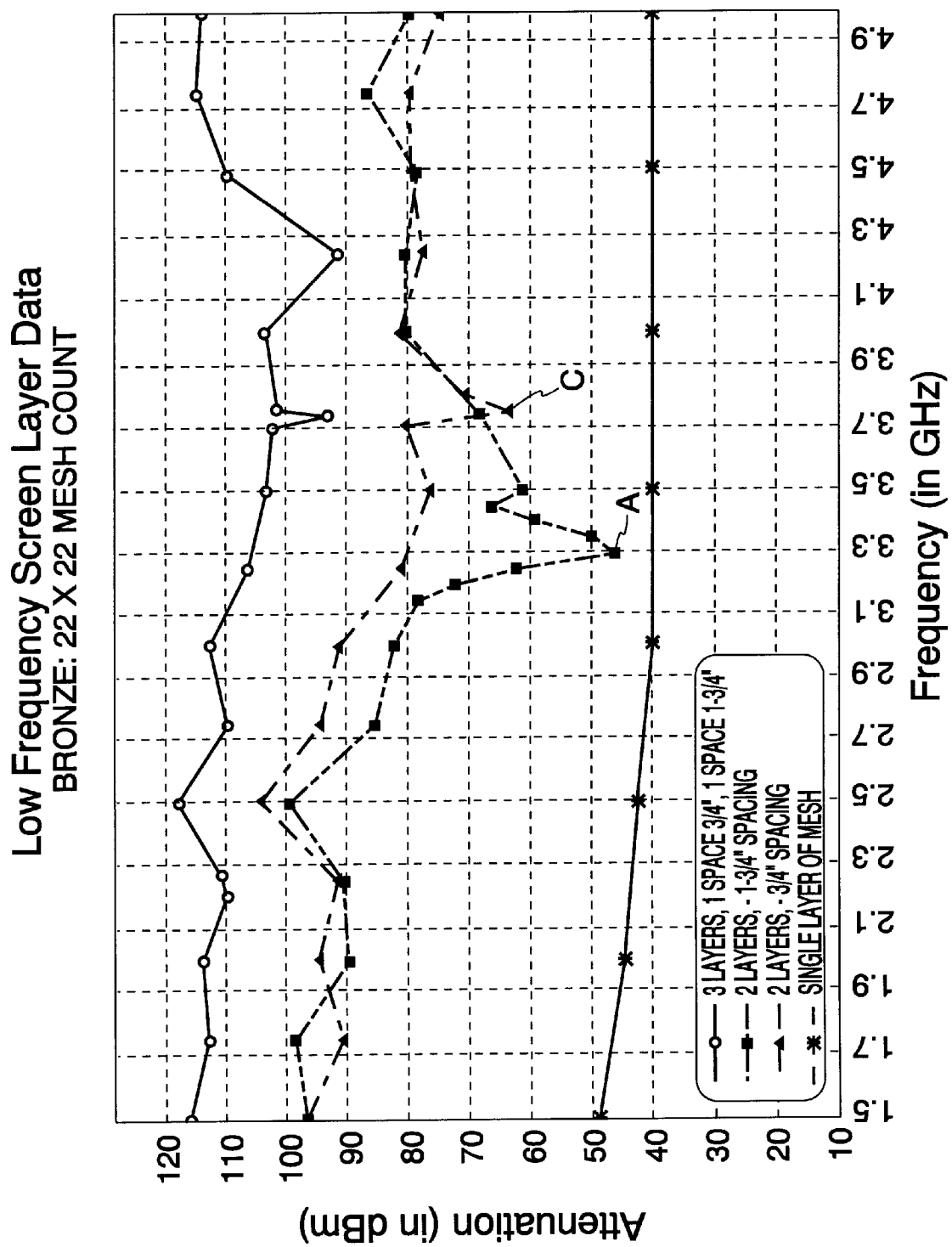
FIG. 3 is a graph showing EMI Shielding in the 1.5 GHz to 5 GHz frequency range when one, two and three layers of conductive substrate are utilized, in accordance with the present invention.

Referring to FIGS. 3 and 4, a graph is displayed showing the improved EMI shielding in the 1 GHZ to 11 GHZ frequency range for a three planar screen design, a two planar screen design with a one and three-quarter inch separation there between, and a two planar screen design with a three-quarter inch separation there between and a single screen.

FIGS. 3 and 4 illustrate the superior attenuation characteristics of the invented three-screen system, whereby attenuations at or above 100 dB are achieved. That the superior attenuation characteristics of the three-screen system is due to the reduction of EM-resonance, particularly when compared to two-screen systems above 10 MHz, is also illustrated. For example, when two screens are used, EMI attenuation decreases substantially at certain initial frequencies and resonance/harmonic frequencies—compare for example the resonance point at 3.3 GHZ (point A in FIG. 3) and its two-fold multiple at 6.6 GHZ (point B in FIG. 4). Other resonance points of interest are designated as C, D and E on the two figures. No significant resonance or harmonic effects are seen in the three-screen system at those frequencies. Thus the instant invention not only improves shielding overall, it optimizes shielding performance at selected frequencies.

The method described above can be extended by using four or more suitably spaced screens.

Non-parallel Substrates

Figure 5B:
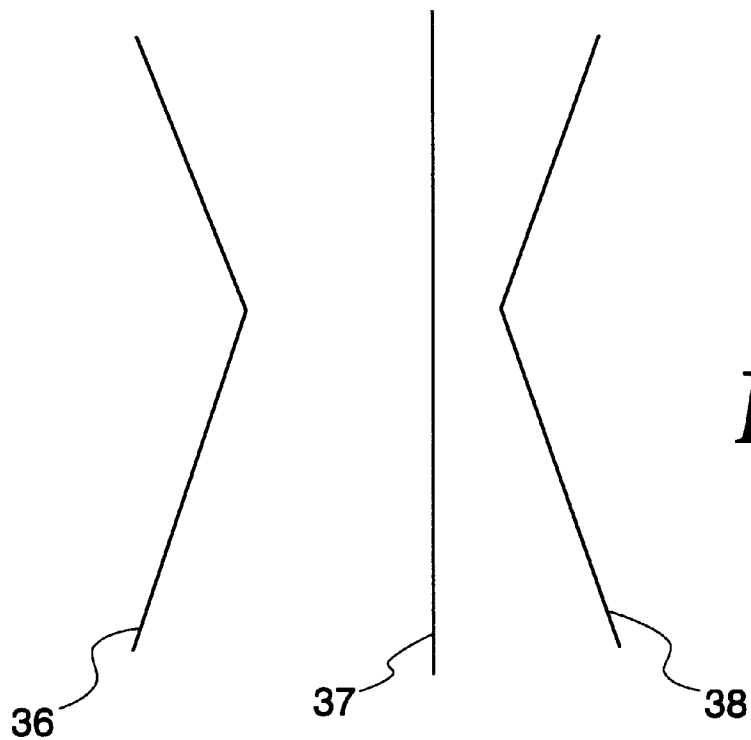
FIG. 5B is a side elevation view of a window comprising non-parallel conductive surfaces in an alternative configuration, in accordance with features of the present invention.
Figure 5C:
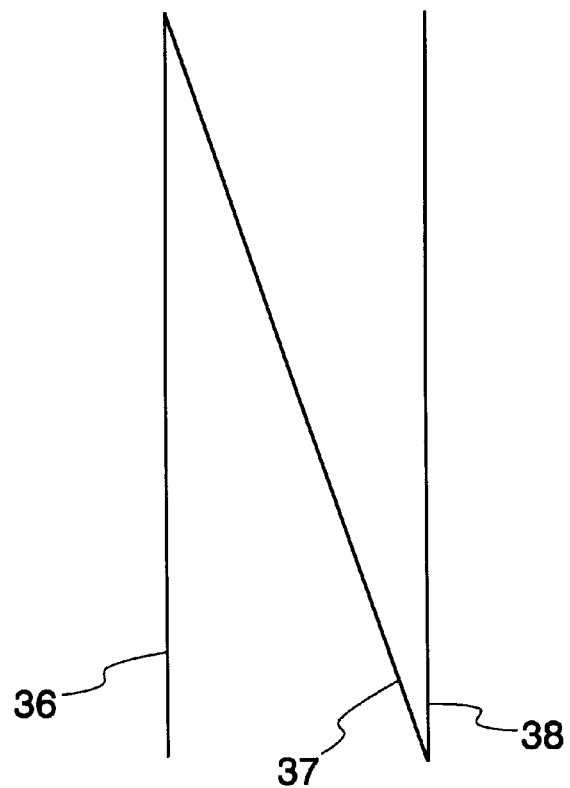
FIG. 5C is a side elevation view of a window comprising non-parallel screens in another alternative configuration, in accordance with features of the present invention.

Referring now to FIGS. 5A, 5B and 5C, side elevation views of alternative designs in accordance with the present invention are provided. As above, three screens are arranged so as to attenuate EMI. However, these designs also utilize non-parallel cavity surfaces to further enhance imperfect phase reflection of the cavity-confined EMI. One way to effect nonparallel surfaces is by pulling or laterally displacing the centers 39 of first and third screens 36 and 38 inwardly to render a portion of the interior walls 19 of the cavities 15 convex, as shown in FIG. 5A. A less convex configuration of the side screens is depicted in FIG. 5B. Alternatively, the centers could also be displaced outwardly thereby rendering the interior walls concave, or stated another way, the first and third screens 36 and 38 could be configured in a substantially curved design such that respective arcuate portions are positioned in opposition. Alternatively, two of the three screens are arranged in a "V" configuration, as depicted in FIG. 5C.

Lastly, the first and third screens could be manipulated to have differently shaped surfaces facing each other, for example by positioning the first screen 36 laterally or outwardly from the center, to provide a more concave surface, while positioning the third screen 38 inwardly or medially to provide a more convex surface. Another suitable screen configuration includes positioning the two flanking screens 36 and 38 so as to form a "V", with the middle screen 37 in effect dividing (either equally or unequally) the acute angle formed between the flanking screens.

In one method for providing non-parallel cavity surfaces, one end of a simple wire is attached to the center 39 of the first screen 36 and the other end of the wire is attached to the respective center 39 of the third screen 38 so as to pull or laterally displace the centers 39 of the outer-most screens inwardly and toward the middle screen to render a portion of the interior walls 19 of the cavities convex. Another method of providing curved cavity surfaces is to first fabricate rigid conductive materials to the desired shape and then metallizing these non-flat surfaces in the same method as described above in "Substrate Material Detail" for flat conducting substrates.

As in the prior design, distances between any two adjacent substrates should not be equal to an integral multiple to the corresponding distances with the other screen.

Figure 6:
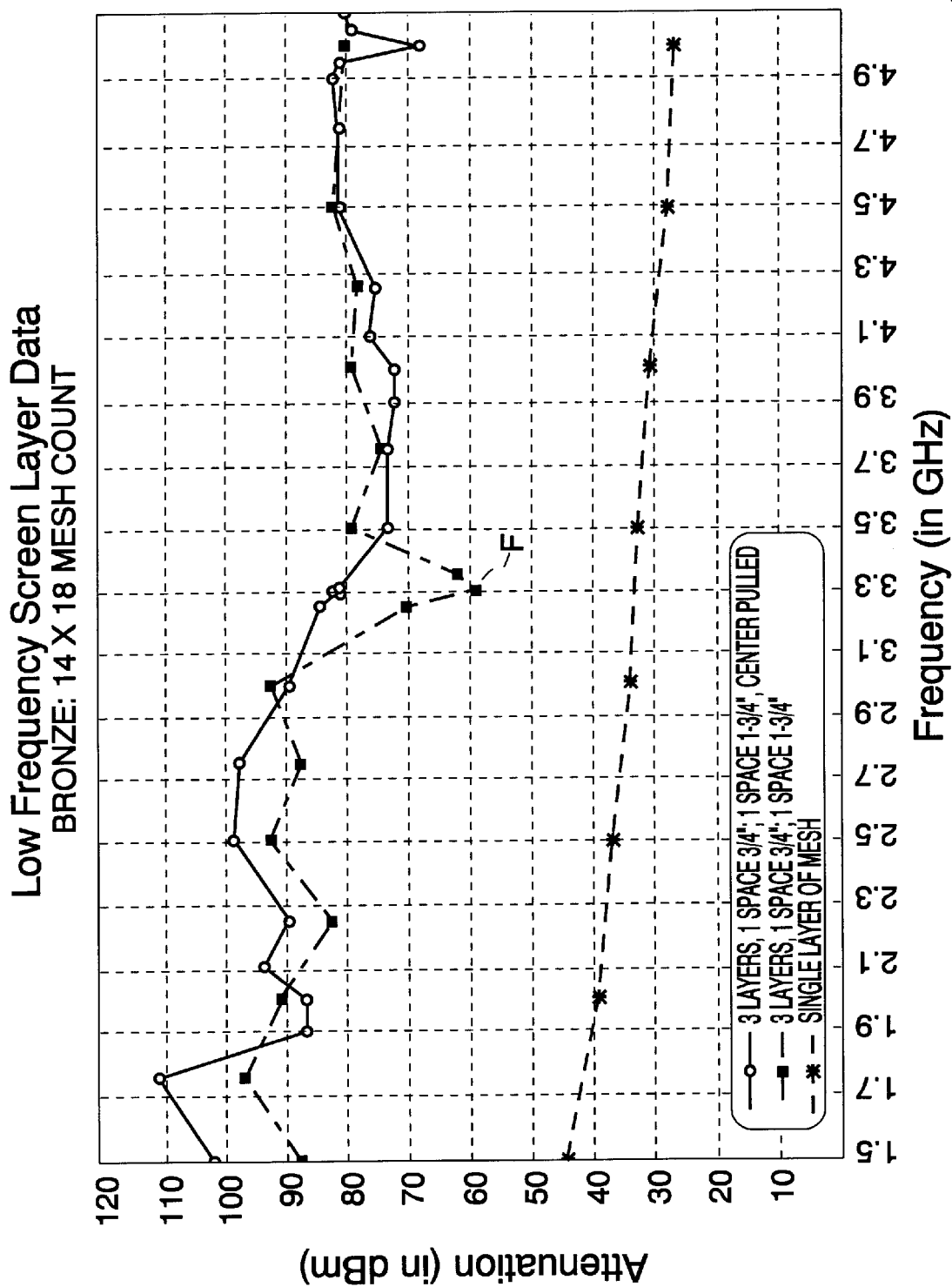
FIG. 6. is a graph showing EMI shielding in the 1.5 GHz to 5.1 GHz frequency range when parallel and non-parallel conductive surfaces are utilized, in accordance with the present invention.
Figure 7:
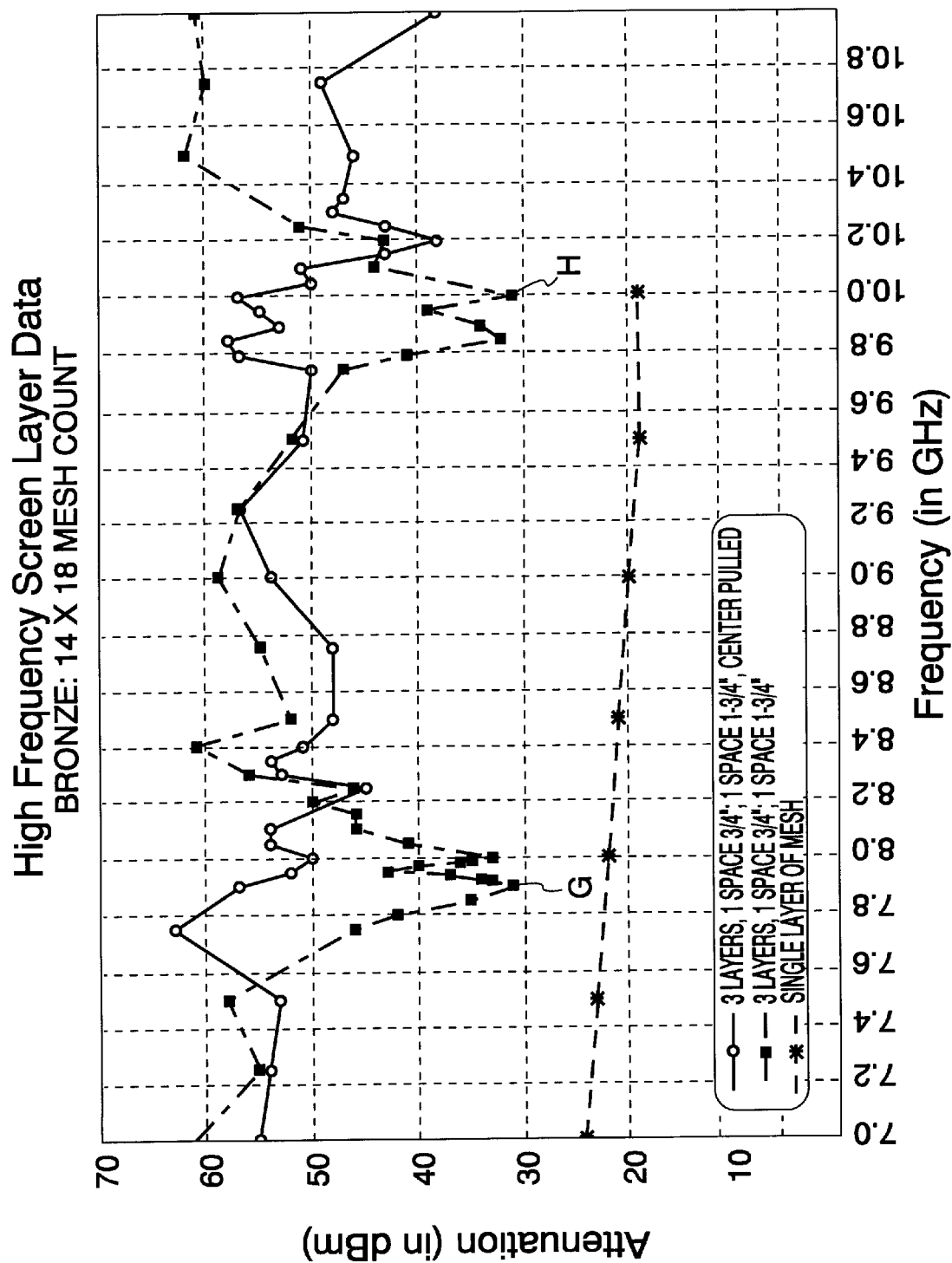
FIG. 7 is a graph showing EMI shielding in the 7 GHz to 11 GHz frequency range when parallel and non-parallel conductive surfaces are utilized, in accordance with the present invention.

FIGS. 6 and 7 compare EMI attenuation values to frequency for a three screen center pulled design, a three planar screen design, and a single screen. The 14×18 designation in the legends of the plots are mesh counts.

FIGS. 6 and 7 clearly illustrate that the three-screen, center-pulled design attenuates better at certain resonant frequencies than does the three planar screen design. (See points F, G and H). At 7.9 GHz (point G in FIG. 7) for example, a three-screen parallel configuration experiences a degradation (down to 31 dB) in attenuation due to the resonance created by the distance between the inner screen 36 and the outer screen 38. This compares to a higher attenuation value of more than 50 dB that is provided by the center-pulled configuration.

However, as shown on FIG. 7, at some higher frequencies, the three parallel screen configuration exhibits better EMI attenuation (except at resonant frequencies) than does the center pulled configuration.

Inasmuch as the superior attenuation characteristics of the three-screen embodiment are due to preventing resonance and harmonics of the impinging radiation, the non-parallel juxtaposition (e.g., "center pulled") design can also be used in a two screen configuration to achieve some improvement. A suitable choice of screen separation and shape can ensure adequate shielding at a specified frequency. Also, non-parallel screens can be applied to a design incorporating four or more screens.

The invention is particularly valuable in removing or shifting resonance points away from frequencies of interest. The operation of the invention can be described as a method for attenuating electromagnetic radiation by causing the electromagnetic radiation to strike a first electrically conductive planar substrate, resulting in a first portion of the electromagnetic radiation passing through the substrate and a second portion of the electromagnetic radiation not passing through the first substrate; and then subjecting the now-passed through radiation to a means for preventing the production of resonance frequencies of the now-passed through radiation.

The resonance prevention means comprises a cavity defined by the first electrically conductive planar substrate and a plurality of additional electrically conductive planar substrates juxtaposed to the first electrically conductive planar substrate and along a direction that is opposite from the point of origin of the electromagnetic radiation.

In summary, the invention provides an optimum shielding substrate and a method to optimize EMI shielding performance in a myriad of applications. The invented method and substrate is all purpose in utility and therefore can be used in enclosure wall-, ceiling-, window- and partition-construction, and also to facilitate shielding in electronic product manufacture, electric vehicle manufacture, and military and industrial applications where surreptitious eavesdropping is a concern.

As such, typical conductive substrates (screens and metallized lattices, discussed supra) and atypical conductive substrates can be utilized, such atypical substrates including, but not limited to, conductive materials arranged in non-orthogonal patterns, such as triangular, honeycomb, and circular patterns, whereby the pattern elements may be arranged concentrically or else sized the same and arranged coplanarly to define a continuous substrate. By selecting the appropriate materials, the method and substrate can add a see-through and hear-through component to any shielding endeavor.

While the invention has been described with reference to the details of the illustrated embodiment, these details are not intended to limit the scope of the invention as defined in the appended claims. For example, and as noted supra, two, three or more than three substrates can be positioned relative to each other and their surfaces individually modified or molded to achieve optimum performance of EMI attenuation at target frequencies.

The embodiment of the invention in which an exclusive property or privilege is claimed is defined as follows:

1. An EMI attenuation device comprising:
   a.) a first electrically conductive planar member spatially positioned adjacent to and at a first distance from a second electrically conductive planar member; and
   b.) a third electrically conductive planar member spatially positioned adjacent to and at a second distance from said second member; with the first and second distances selected so that when the first distance induces resonance to impinging radiation, the second distance cancels the resonance.

2. The device as recited in claim 1 wherein said first distance and said second distance are dissimilar.

3. The device as stated in claim 1 wherein adjacent (surfaces) members are parallel to each other.

4. The device as recited in claim 1 wherein at least two adjacent (surfaces) members are not parallel to each other.

5. The device as recited in claim 1 further comprising a fourth planar member positioned proximal to said third planar member and distal to first planar member.

6. The device as recited in claim 1 wherein said electrically conductive planar members comprise material arranged in an orthogonal array.

7. The device as recited in claim 1 wherein the attenuation is approximately 90 to 120 dB.

8. The device as recited in claim 1 wherein said planar members are screens comprised of mesh patterns, each of said mesh patterns being a grid and having a mesh count.

9. The device as recited in claim 8 wherein the mesh count of said first member is smaller than the mesh count of said second member.

10. The device as recited in claim 9 wherein the mesh count of said second member is smaller than the mesh count of said third member.

11. The device as recited in claim 9 wherein the mesh count of said members is between 8 and 200 per inch.

12. The device as recited in claim 1 wherein said distance separating said first (surface) member from said second (surface) member is between one third of an inch and 30 inches.

13. The device as recited in claim 1 wherein said distance separating said (first surface) third member from said second (surface) member is between one third of an inch and 12 inches.

14. The device as recited in claim 1 wherein said electrically conductive (material) members are optically clear.

15. The device as recited in claim 1 wherein said electrically conductive (material) members are an optically clear substrates which is metallized.

16. The device as recited in claim 15 wherein the optically clear substrate is selected from the group consisting of glass, plastic, material arranged in a webbing configuration, grid material, or combinations thereof.

17. The device as recited in claim 1 wherein the electrically conductive planar members have a resistance of less than 12 ohms per square.

18. The device as recited in claim 1 wherein no adjacent planar members are parallel to each other.

19. The device as recited in claim 1 wherein said first distance and said second distance are selected so as to maximize the attenuation of EMI at a pre-determined EMI frequency.

20. The device as recited in claim 1 wherein said first distance is selected to achieve a first attenuation level at a particular EMI frequency and the second distance is selected to effect additional attenuation of the EMI of the particular frequency.

21. The device as recited in claim 1 wherein said first distance and second distance are selected so as to maximize the attenuation of EMI over a range of pre-determined frequencies.

22. The device as recited in claim 1 further comprising a means for stretching or relaxing the positioned planar members.

23. A device for attenuating impinging electromagnetic interference radiation comprising:

a.) a first defined space having a plurality of walls configured from first and second electrically conductive shielding means;

b) a second defined space having a plurality of walls configured from said second electrically conductive shielding means and a third electrically conductive shielding means; and c) means for positioning said first, second and third shielding means whereby distances between adjacent walls of said first and second shielding means are dissimilar to corresponding collinear distances between adjacent walls of said second and third shielding means, with said spaces so selected that when the first defined space produces a resonance to the impinging radiation, the second defined space cancels the resonance.

24. The EMI attenuation device as recited in claim 23 wherein at least one of the shielding means further comprise screen.

25. The device as recited in claim 23 wherein the electrically conductive shielding means are optically clear.

* * * * *